US009666647B2

(12) United States Patent
Yan et al.

(10) Patent No.: US 9,666,647 B2
(45) Date of Patent: May 30, 2017

(54) OLED DISPLAY AND METHOD OF MANUFACTURING THE SAME

(71) Applicant: BOE TECHNOLOGY GROUP CO., LTD., Beijing (CN)

(72) Inventors: Guang Yan, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 127 days.

(21) Appl. No.: 14/648,091

(22) PCT Filed: Aug. 26, 2014

(86) PCT No.: PCT/CN2014/085172
§ 371 (c)(1),
(2) Date: May 28, 2015

(87) PCT Pub. No.: WO2015/143831
PCT Pub. Date: Oct. 1, 2015

(65) Prior Publication Data
US 2016/0268347 A1 Sep. 15, 2016

(30) Foreign Application Priority Data
Mar. 27, 2014 (CN) .......................... 2014 1 0119112

(51) Int. Cl.
H01L 27/32 (2006.01)
H01L 51/56 (2006.01)
H01L 51/50 (2006.01)

(52) U.S. Cl.
CPC ........ H01L 27/322 (2013.01); H01L 27/3211 (2013.01); H01L 27/3248 (2013.01);
(Continued)

(58) Field of Classification Search
USPC ................................................ 445/23–25, 59
See application file for complete search history.

(56) References Cited

U.S. PATENT DOCUMENTS

2009/0051275 A1* 2/2009 Kobayashi .......... H01L 51/5265
313/504
2010/0219748 A1* 9/2010 Kondakova ............ C09K 11/06
313/504
(Continued)

FOREIGN PATENT DOCUMENTS

CN 1649455 A 8/2005
CN 103050630 A 4/2013
(Continued)

OTHER PUBLICATIONS

International Search Report in Chinese dated Dec. 12, 2014, for corresponding PCT Application No. PCT/CN2014/085172.

Primary Examiner — Ashok Patel
(74) Attorney, Agent, or Firm — Kinney & Lange, P.A.

(57) ABSTRACT

There are provided an OLED display and a method of manufacturing the same, in order to improved resolution of the OLED display. The OLED display comprises a substrate and a plurality of light emitting array units provided and periodically arranged on the substrate, each light emitting array unit comprising first, second and third light emitting units arranged in this order. Each light emitting unit comprises an anode, a cathode and an organic material functional layer located therebetween, the organic material functional layer comprising a light emitting layer. For each light emitting array unit, the first light emitting layer is formed within the first and second light emitting units, the second light emitting layer is formed within the second and third light emitting units, and the first and second light emitting layers are configured to emit light of different colors; in the second light emitting unit, the first and second light emitting layers overlap with each other and are configured so that only one of them is capable of emitting light. In each light emitting array unit, one of two light emitting units which have the same light emitting layer for emitting light further (Continued)

comprises a light color conversion layer arranged on a light exiting side of the one light emitting unit, the light color conversion layer being configured to convert light from its corresponding light emitting layer to light having a color different from those of light emitted by other light emitting units of the light emitting array unit.

20 Claims, 4 Drawing Sheets

(52) U.S. Cl.
CPC ...... *H01L 27/3258* (2013.01); *H01L 27/3262* (2013.01); *H01L 51/5012* (2013.01); *H01L 51/56* (2013.01)

(56) References Cited

U.S. PATENT DOCUMENTS

2012/0274201 A1* 11/2012 Seo .................. H01L 51/0085
 313/504
2014/0159022 A1* 6/2014 Song .................. H01L 27/3248
 257/40

FOREIGN PATENT DOCUMENTS

| CN | 103325952 A | 9/2013 |
| CN | 103943658 A | 7/2014 |
| CN | 203746914 U | 7/2014 |
| EP | 1003211 A2 | 5/2000 |

\* cited by examiner

OLED DISPLAY AND METHOD OF MANUFACTURING THE SAME

BACKGROUND OF THE INVENTION

Field of the Invention

Embodiments of the present invention generally relate to the field of display technologies, and particularly, to an OLED display and a method of manufacturing the same.

Description of the Related Art

An organic light emitting diode (OLED for short) display is an organic film electroluminescent display, which has advantages such as simple manufacturing processes, a low cost, convenience in forming a flexible structure, wide angle of view and the like. Thus, the display technology of organic light emitting diode has been becoming an important display technology.

Among others, application of luminescent materials to emit light independently is the most common way of achieving a full color display in the OLED display at present, in which way precise metal masks and pixel alignment technologies are applied, and red, green and blue light emitting layers are manufactured by an evaporation method.

However, the resolution of the OLED display manufactured by the above way is limited due to precision in pattern size of the metal mask.

SUMMARY OF THE INVENTION

One object of embodiments of the present invention is to provide OLED display and a method of manufacturing the same, in order to improve the resolution of the OLED display.

According to one aspect of the present invention, there is provided an OLED display, comprising a substrate and a plurality of light emitting array units provided and periodically arranged on the substrate, each light emitting array unit comprising a first light emitting unit, a second light emitting unit and a third light emitting unit arranged in this order, wherein, each of the first light emitting unit, the second light emitting unit and the third light emitting unit comprises an anode, a cathode and an organic material functional layer located between the anode and the cathode, the organic material functional layer comprising a light emitting layer;

for each light emitting array unit, the first light emitting layer is formed within the first light emitting unit and the second light emitting unit, the second light emitting layer is formed within the second light emitting unit and the third light emitting unit, and the first light emitting layer is configured to emit light having a color different from that of light emitted by the second light emitting layer;

in the second light emitting unit, the first light emitting layer and the second light emitting layer overlap with each other and are configured so that only one of them is capable of emitting light; and in each light emitting array unit, one of two light emitting units which have the same light emitting layer for emitting light further comprises a light color conversion layer arranged on a light exiting side of the one light emitting unit, the light color conversion layer being configured to convert light from its corresponding light emitting layer to light having a color different from those of light emitted by other light emitting units of the light emitting array unit.

In the above display, the first light emitting layer and the second light emitting layer may be formed through an evaporation process, and a width of each of the first light emitting layer and the second light emitting layer may be substantially equal to a minimum precision width of a metal mask used in the evaporation process.

In the above display, the first light emitting layer and the second light emitting layer may be respectively a green light emitting layer and a blue light emitting layer, and the light color conversion layer may be configured to convert green light or blue light into red light.

In the above display, the second light emitting layer within the second light emitting unit may be configured for emitting light, and the light color conversion layer is arranged on a light exiting side of the organic material functional layer within the second light emitting unit or within the third light emitting unit; or, the first light emitting layer within the second light emitting unit may be configured for emitting light, and the light color conversion layer is arranged on a light exiting side of the organic material functional layer within the first light emitting unit or within the second light emitting unit.

In the above display, carrier transportation characteristics of the first light emitting layer and the second light emitting layer and/or an energy level relationship between the first light emitting layer and the second light emitting layer may be configured so that holes from the anode and electrons from the cathode can only be combined within one of the first light emitting layer and the second light emitting layer within the second light emitting unit.

In the above display, each light emitting array unit may further comprise a barrier layer arranged between the first light emitting layer and the second light emitting layer within the second light emitting unit, and the barrier layer is configured, within the second light emitting unit, to block one of the electrons and the holes, which has been injected into one light emitting layer, from being injected into the other light emitting layer, and to allow the other one of the electrons and the holes to be injected into the one light emitting layer.

In the above display, the barrier layer may be further extend into one of the first light emitting unit and the third light emitting unit of the same one light emitting array unit, and is configured to allow both of the electrons and the holes to be injected into the light emitting layer of the light emitting unit into which the barrier layer extends.

The OLED display may further comprise thin film transistors each corresponding to the respective light emitting units, a drain of each thin film transistor is electrically connected with the anode of its corresponding light emitting unit, and each thin film transistor is arranged close to the anode of its corresponding light emitting unit.

In the above display, the light color conversion layer may be arranged between the anode and the substrate when the anode is made of a transparent material and the cathode is made of an opaque material; alternatively, the light color conversion layer may be arranged on one side of the cathode away from the substrate when the cathode is made of a transparent material and the anode is made of an opaque material; or, there are provided the light color conversion layers respectively between the anode and the substrate and on one side of the cathode away from the substrate when both the anode and the cathode are made of transparent materials.

In a second aspect of the present invention, there is provided a method of manufacturing an OLED display, the OLED display comprising a substrate and a plurality of light emitting array units provided and periodically arranged on the substrate, each light emitting array unit comprising a first light emitting unit, a second light emitting unit and a third light emitting unit arranged in this order; the method comprises steps of forming the first light emitting unit, the second light emitting unit and the third light emitting unit for each light emitting array unit, the steps comprising:

forming, on the substrate, first electrodes through a patterning process at positions corresponding to the first light emitting unit, the second light emitting unit and the third light emitting unit;

forming, on the substrate formed with the first electrodes, a first light emitting layer through an evaporation process within regions corresponding to the first light emitting unit and the second light emitting unit;

forming, on the substrate formed with the first light emitting layer, a second light emitting layer, which emits light having a color different from that of light emitted by the first light emitting layer, through an evaporation process within regions corresponding to the second light emitting unit and the third light emitting unit, such that within the second light emitting unit, the first light emitting layer and the second light emitting layer overlap with each other and are configured so that only one of them is capable of emitting light; and forming, on the substrate formed with the second light emitting layer, a second electrode through a patterning process at positions corresponding to the first light emitting unit, the second light emitting unit and the third light emitting unit.

the method further comprises a step of forming, within one of two light emitting unit of each light emitting array unit which have the same light emitting layer for emitting light, a light color conversion layer through a patterning process on a light exiting side of the one light emitting unit, the light color conversion layer being configured to convert light from its corresponding light emitting layer to light having a color different from those of light emitted by other light emitting units of the light emitting array unit.

In the above method, each of the first light emitting layer and the second light emitting layer formed through the evaporation process may have a width which is substantially equal to a minimum precision width of a metal mask used in the evaporation process.

In the above method, the first light emitting layer may be selected as one of a green light emitting layer and a blue light emitting layer, the second light emitting layer may be selected as the other one, and the light color conversion layer is configured to convert green light or blue light into red light.

In the above method, when the second light emitting layer within the second light emitting unit is configured for emitting light, the step of forming a light color conversion layer may comprise forming, within a region corresponding to the second light emitting unit or the third light emitting unit, the light color conversion layer on a light exiting side of the light emitting unit; or when the first light emitting layer within the second light emitting unit is configured for emitting light, the step of forming a light color conversion layer may comprise forming, within a region corresponding to the first light emitting unit or the second light emitting unit, the light color conversion layer on a light exiting side of the light emitting unit.

In the above method, the steps of forming the first light emitting layer and the second light emitting layer may comprise: configuring carrier transportation characteristics of the first light emitting layer and the second light emitting layer and/or an energy level relationship between the first light emitting layer and the second light emitting layer so that holes from the anode and electrons from the cathode can only be combined within one of the first light emitting layer and the second light emitting layer within the second light emitting unit.

The above method may further comprise, after forming the first light emitting layer and before forming the second light emitting layer, the following step of:

forming a barrier layer at least within a region corresponding to the second light emitting unit, the barrier layer being configured, within the second light emitting unit, to block one of the electrons and the holes, which has been injected into one light emitting layer, from being injected into the other light emitting layer, and to allow the other one of the electrons and the holes to be injected into the one light emitting layer.

In the above method, the step of forming a barrier layer may comprises: forming the barrier layer through an evaporation process within regions corresponding to the first light emitting unit and the second light emitting unit, or regions corresponding to the second light emitting unit and the third light emitting unit, of each light emitting array unit, so as to allow both of the electrons and the holes to be injected into the light emitting layer of the first light emitting unit or the third light emitting unit.

The above method may further comprise, before forming the first electrodes, a step of forming a thin film transistor; wherein when the first electrode is an anode and the second electrode is a cathode, a drain of the thin film transistor is electrically connected with the anode.

In the above method, when the first electrodes are made of a transparent material and the second electrode is made of an opaque material, the light color conversion layer may be formed on the substrate before forming the first electrodes; alternatively, when the second electrode is made of a transparent material and the first electrode is made of an opaque material, the light color conversion layer may be formed on one side of the second electrode away from the substrate after forming the second electrode; or when both the first electrodes and the second electrode are made of transparent materials, there may be formed the light color conversion layers respectively between the anode and the substrate and on one side of the second electrode away from the substrate.

In the OLED display and method of manufacturing the same provided according to the embodiments of the present invention, the first light emitting layer are formed within both of the first light emitting unit and the second light emitting unit, meanwhile, the second light emitting layer is formed within both of the second light emitting unit and the third light emitting unit, and the first light emitting layer and the second light emitting layer overlap with each other within the second light emitting unit, thereby the first light emitting layer within the first light emitting unit, the first light emitting layer or second light emitting layer within the second light emitting unit, and the second light emitting layer within the third light emitting unit can be controlled to emit light; from this, the position where the light color conversion layer is formed is selected so that the first light emitting unit, the second light emitting unit and the third light emitting unit respectively emit one of blue, green and red light. As such, each of the first light emitting layer and the second light emitting layer formed through an evaporation process may have a width which is substantially equal to a minimum precision width of a metal mask used in the evaporation process, thereby reducing the width of the light emitting layer within each light emitting unit. With the embodiments of the present invention, when compared to prior arts, it can avoid the problem of low resolution of the OLED display resolution due to limitation of precision in pattern size of the metal mask when manufacturing the light emitting layers within respective light emitting units, and the OLED display provided according to the embodiments of the present invention has higher resolution.

BRIEF DESCRIPTION OF THE DRAWINGS

Accompanying drawings, which will used when describing embodiments of the present invention or prior arts, will be briefly described in order to illustrate technique solutions in the embodiments of the present invention or in prior arts more clearly. Obviously, the accompanying drawings described in the following description are only to illustrate some embodiments of the present invention, and other drawings may be obtained according to these accompanying drawings without creative work.

REFERENCE NUMBERS

Figure 1:
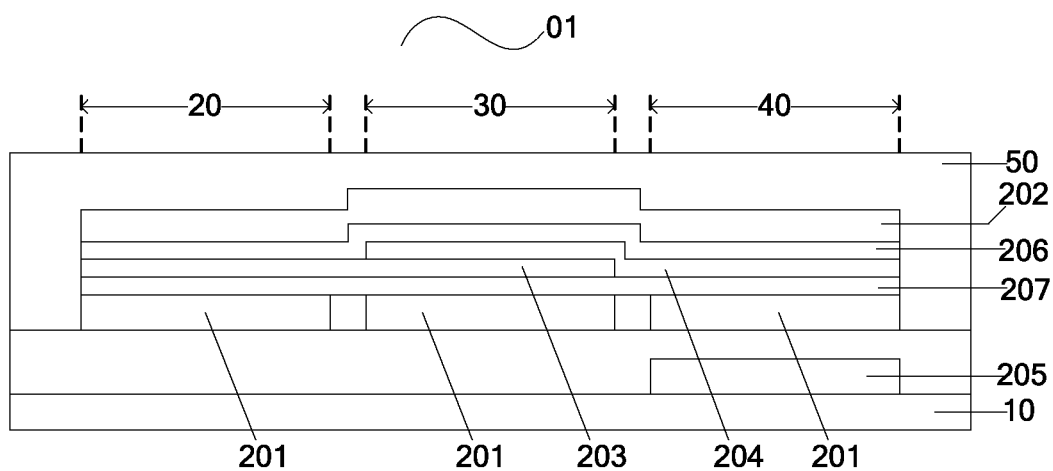
FIG. 1 is a structural schematic diagram showing a portion of an OLED display provided according to one exemplary embodiment of the present invention.

01-OLED display; 10-substrate; 20-first light emitting unit; 30-second light emitting unit; 40-third light emitting unit; 50-packaging layer; 60-thin film transistor; 201-anode; 202-cathode; 203-first light emitting layer; 204-second light emitting layer; 205-light color conversion layer;

206-electron transportation layer; 207-hole transportation layer; 208-barrier layer; 601-gate; 602-gate insulating layer; 603-semiconductor active layer; 604-source; 605-drain.

DETAILED DESCRIPTION OF THE EMBODIMENTS

Technique solution in embodiments of the present disclosure will be described hereinafter in detail with reference to the attached drawings. Obviously, the described embodiments are only some, rather than all, of embodiments of the present disclosure. Based on the embodiments of the present disclosure, all of other embodiments obtained by those skilled in the art without any creative work will fall within the scope of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
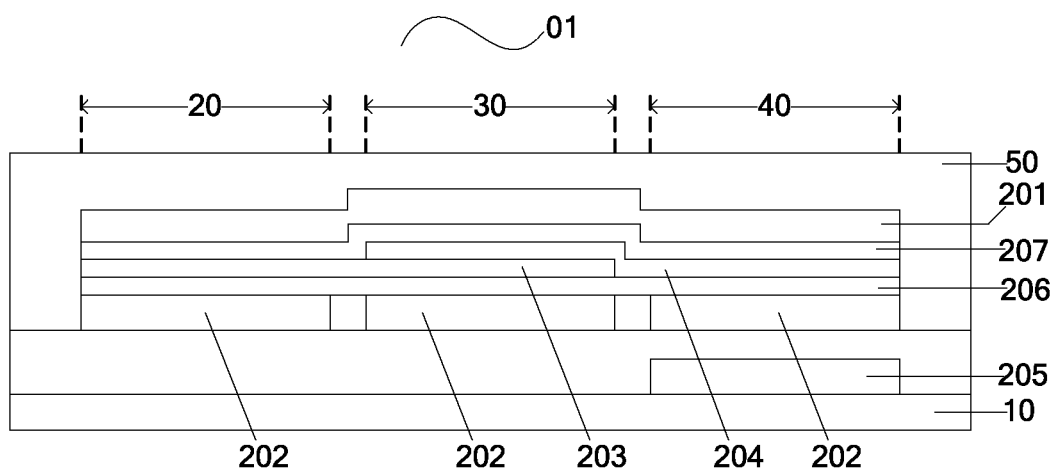
FIG. 2 is a structural schematic diagram showing a portion of an OLED display provided according to another exemplary embodiment of the present invention.
Figure 3:
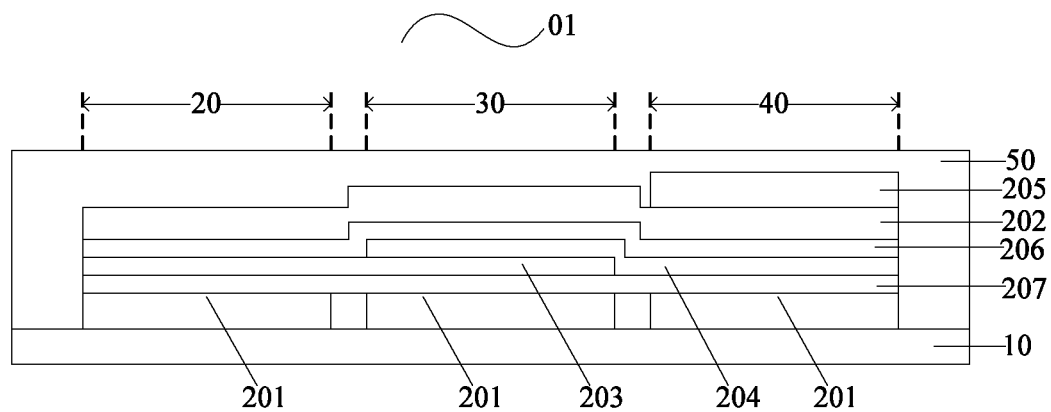
FIG. 3 is a structural schematic diagram showing a portion of an OLED display provided according to a further exemplary embodiment of the present invention.

A plurality of embodiments of the present invention provides an OLED display 01, as shown in FIG. 1 to FIG. 3, and the OLED display 01 comprises a substrate 10 and a plurality of light emitting array unit provided and periodically arranged on the substrate, each light emitting array unit comprising a first light emitting unit 20, a second light emitting unit 30 and a third light emitting unit 40 arranged in this order, that is, the second light emitting unit 30 is arranged between the first light emitting unit 20 and the third light emitting unit 40; each of the first light emitting unit 20, the second light emitting unit 30 and the third light emitting unit 40 includes an anode 201, a cathode 202 and an organic material functional layer located between the anode 201 and the cathode 202, the organic material functional layer comprises a light emitting layer, such as first and second light emitting layers to be describe below.

Specifically, within each light emitting array unit of the OLED display 01, a first light emitting layer 203 is formed within the first light emitting unit 20 and the second light emitting unit 30, a second light emitting layer 204 is formed within the second light emitting unit 30 and the third light emitting unit 40, and the first light emitting layer 203 is configured to emit light having a color different from that of light emitted by the second light emitting layer 204. Further, in the second light emitting unit 30, the first light emitting layer 203 and the second light emitting layer 204 overlap with each other and are configured so that only one of them is capable of emitting light within the second light emitting unit 30. Preferably, the first light emitting layer 203 and the second light emitting layer 204 completely overlap with each other within the second light emitting unit 30.

Further, in each light emitting array unit, one of two light emitting units which have the same light emitting layer for emitting light further comprises a light color conversion layer 205 arranged on a light exiting side of the one light emitting unit, and the light color conversion layer is configured or configurated to convert light from its corresponding light emitting layer to light having a color different from those of light emitted by other light emitting units of the light emitting array unit.

The organic material functional layer is configured so that respective light emitting units of the OLED display 01 emit light; accordingly, besides the light emitting layer, the organic material functional layer may further comprise an electron transportation layer 206 arranged between the cathode 202 and the corresponding light emitting layer, and a hole transportation layer 207 arranged between the anode 201 and the corresponding light emitting layer, as shown in FIGS. 1-8. Further, in order improve efficiency of injecting electrons and holes into the light emitting layer, the organic material functional layer may further comprise an electron injection layer (not shown) arranged between the cathode 202 and the corresponding electron transportation layer 206, and a hole injection layer (not shown) arranged between the anode 201 and the corresponding hole transportation layer 207.

According to the embodiments of the present invention, when working voltages are applied to the anode 201 and the cathode 202 of the OLED display 01 simultaneously, both holes from the anode 201 and electrons from the cathode 202 are injected into the corresponding light emitting layer; the holes and the electrons meet with each other within the light emitting layer and recombine together to form electron-hole pair and to release energy; the energy is emitted in form of light, which passes through different luminescent molecules of the light emitting layer so as to present as light of different colors, and is evenly emitted from both sides of the organic material functional layer.

The above OLED display 01 provided according to the embodiments of the present invention may include a plurality of pixel units (not shown) arranged in an array, each pixel unit corresponding to one light emitting array unit comprising the first light emitting unit 20, the second light emitting unit 30 and the third light emitting unit 40. The first light emitting unit 20, the second light emitting unit 30 and the third light emitting unit 40 within each light emitting array unit may respectively correspond to one of a red light emitting unit, a green light emitting unit, and a blue light emitting unit, and the specific corresponding relationship there among is not limited here.

In the above OLED display 01 provided according to the embodiments of the present invention, the second light emitting unit 30 includes cascaded first light emitting layer 203 and second light emitting layer 204, which emit light of different colors in order to achieve a full color display. Thus, only one of the light emitting layers within the second light emitting unit 30 is allowed to emit light, that is, only the first light emitting layer 203 or the second light emitting layer 204 emits light, thereby avoiding mixed color due to simultaneous emitting of light of the two light emitting layers within the second light emitting unit 30.

As an example, when the first light emitting layer 203 within the second light emitting unit 30 is configured to emit light, it emits light having the same color as that of light emitted by the first light emitting layer 203 within the first light emitting unit 20; thus, the light color conversion layer 205 is provided on the light exiting side of the first light emitting layer 203 within the first light emitting unit 20 or the second light emitting unit 30 so as to covert light emitted from its corresponding light emitting layer into light of different color, thereby differentiating light emitted from the first light emitting unit 20 from that emitted from the second light emitting unit 30 in color. As shown in FIG. 5, the light color conversion layer 205 is arranged within the first light emitting unit 20 so as to convert light emitted by the corresponding light emitting layer 203 into light having a color different from that of light emitted by the second light emitting unit 30. In another example, when the second light emitting layer 204 within the second light emitting unit 30 is configured to emit light, it emits light having the same color as that of light emitted by the second light emitting layer 204 within the third light emitting unit 40; thus, the light color conversion layer 205 is provided on the light exiting side of the second light emitting layer 204 within the second light emitting unit 30 or the third light emitting unit 40 so as to differentiate light emitted from the second light emitting unit 30 from that emitted from the third light emitting unit 40 in color. As shown in FIGS. 1-4 and 6-8, the light color conversion layer 205 is provided within the third light emitting unit 40 to perform color conversion to light emitted from its corresponding light emitting layer. Although no shown in the figures, obviously, the light color conversion layer may also be provided within the second light emitting unit as desired.

In the above OLED display 01 provided according to the embodiments of the present invention, both the first light emitting unit 20 and the second light emitting unit 30 includes the first light emitting layer 203, thus during manufacturing the first light emitting layer 203 of organic material by an evaporation method, the first light emitting layer 203 may be simultaneously formed regions corresponding to the adjacent first light emitting unit 20 and second light emitting unit 30 of the same one light emitting array unit, that is, the range where the adjacent first light emitting unit 20 and second light emitting unit 30 are formed is used as a minimum precision for evaporating the first light emitting layer 203.

Likewise, since both the second light emitting unit 30 and the third light emitting unit 40 include the second light emitting layer 204, the range where the adjacent second light emitting unit 30 and third light emitting unit 40 of the same one light emitting array unit is used an a minimum precision for evaporating the second light emitting layer 204.

In an example, in the second light emitting unit 30, the first light emitting layer 203 and the second light emitting layer 204 overlap with each other, and in a preferred example, may completely overlap with each other.

Exemplarily, when manufacturing the first light emitting layer 203 and the second light emitting layer 204 in an evaporation way by using current precise metal masks, it is assumed that a minimum precision width of the metal mask is d, the first light emitting layer 203 having a width of d may be firstly manufactured within the first light emitting unit 20 and the second light emitting unit 30, that is, the first light emitting unit 20 includes a portion of the first light emitting layer 203 which has a width of about d/2, and the second light emitting unit 30 includes the other portion of the first light emitting layer 203 which has a width of about d/2; then, the second light emitting layer 204 having a width of d may be manufactured within the second light emitting unit 30 and the third light emitting unit 40, that is, the second light emitting unit 30 includes a portion of the second light emitting layer 204 which has a width of about d/2, and the third light emitting unit 40 includes the other portion of the second light emitting layer 204 which has a width of about d/2. In one exemplary embodiment, the portion of the first light emitting layer 203 having the width of about d/2 and the portion of the second light emitting layer 204 having the width of about d/2 overlap, preferably, completely overlap, with each other within the second light emitting unit 30. In view of factors such as process errors, layer overlapping, unit spacing and the like, an effective width of the light emitting layer within each light emitting unit is generally slightly smaller than d/2.

As such, both holes from the anode 201 and electrons from the cathode 202 of the first light emitting unit 20 are controlled to inject into the first light emitting layer 203, so that the first light emitting unit 20 emits light of corresponding color, for example, blue light; both holes from the anode 201 and electrons from the cathode 202 of the second light emitting unit 30 are controlled to inject into, for example, the second light emitting layer 204 (or, into the first light emitting layer 203), so that the second light emitting unit 30 emits light of corresponding color, for example, green light; both holes from the anode 201 and electrons from the cathode 202 of the third light emitting unit 40 are controlled to inject into the second light emitting layer 204, and the light color conversion layer 205 arranged on the light exiting side of the second light emitting layer 204 of the third light emitting unit 40 converts light emitted from the second light emitting layer 204 into light of corresponding color, for example, red light.

In order to achieve a sufficient color conversion, it is necessary that a width of the light color conversion layer 205 is equal to the width of the light emitting layer within its corresponding light emitting unit, for example, is about d/2. The minimum precision width of metal mask is d, thus the light color conversion layer 205 with the width of about d/2 may not be manufactured in an evaporation method. Considering that resolution of a photolithography technology used in a patterning process can reach twice the resolution of the metal mask, in order words, the light color conversion layer 205 with the width of about d/2 may be manufactured through the photolithography technology. Thus, in one exemplary embodiment of the present invention, the light color conversion layer 205 is manufactured by using the photolithography technology.

In embodiments of the present invention, a material for the light color conversion layer 205 is not limited, and depends on color to be converted. For example, when it is required to convert green light into red light, or to convert blue light into red light, it only needs to select a material having a corresponding color conversion function.

In exemplary embodiments of the present invention, as shown in FIGS. 1-8, the OLED display 01 may further comprise a packaging layer 50 for packaging the organic material functional layer; wherein the packaging layer 50 may be a thin film package, or may be a substrate package, which is not limited here.

Depending on materials of the anode and the cathode, the OLED display may be classified into a single-face light emitting type OLED display and a double-face light emitting type OLED display. For example, when one of the anode 201 and the cathode 202 is made of an opaque material, the OLED display 01 is of a single-face light emitting type; when both the anode 201 and the cathode 202 are made of a transparent material, the OLED display 01 is of a double-face light emitting type.

Depending on materials of the anode and the cathode, the single-face light emitting type OLED display may be classified into a top light emitting type OLED display and a bottom light emitting type OLED display. As an example, when the anode 201 is provided close to the substrate 10, the cathode 202 is provided away from the substrate 10, the anode 201 is made of a transparent conductive material, and the cathode 202 is made of a opaque conductive material, light will pass through the anode 201 and then exit from a side of the substrate 10, thus, the OLED display 01 may be called as a bottom light emitting type; when the anode 201 is made of an opaque conductive material, the cathode 202 is made of a transparent conductive material, light will pass through the cathode 202, and then exit from the packaging layer 50 provided opposing to the substrate 10, thus, the OLED display 01 may be called as a top light emitting type. Of course, the anode 201 and the cathode 202 may be exchanged in relative positions, which is not described here.

For the OLED display 01 of double-face light emitting type, when the anode 201 is provided closed to the substrate 10, and the cathode 202 is provided away from the substrate 10, or, when the anode 201 is provide away from the substrate 10, the cathode 202 is provide close to the substrate 10, and both the anode 201 and the cathode 202 are made of transparent conductive materials, for example, ITO(Indium Tin Oxide), light, on one hand, passes through the anode 201 and the exits from a side of the substrate 10, and on the other hand, passes through the cathode 202, and then exits from the packaging layer 50 provided opposing to the substrate 10.

In the OLED display provided according to the embodiments of the present invention, the first light emitting layer 203 is formed within both of the first light emitting unit 20 and the second light emitting unit 30 of the same one light emitting array unit, meanwhile, the second light emitting layer 204 is formed within both of the second light emitting unit 30 and the third light emitting unit 40, and the first light emitting layer 203 and the second light emitting layer 204 overlap with each other within the second light emitting unit 30, thereby the first light emitting layer 203 within the first light emitting unit 20, the first light emitting layer 203 or second light emitting layer 204 within the second light emitting unit 30, and the second light emitting layer 204 within the third light emitting unit 30 can be controlled to emit light; from this, the position where the light color conversion layer 205 is formed is selected so that the first light emitting unit 20, the second light emitting unit 30 and the third light emitting unit 40 respectively emit one of blue, green and red light. As such, each of the first light emitting layer 203 and the second light emitting layer 204 formed through an evaporation process may have a width which is substantially equal to a minimum precision width of a metal mask used in the evaporation process, thereby reducing the width of the light emitting layer within each light emitting unit. With the embodiments of the present invention, when compared to prior arts, it can avoid the problem of low resolution of the OLED display resolution due to limitation of precision in pattern size of the metal mask when manufacturing the light emitting layers within respective light emitting units, and the OLED display provided according to the embodiments of the present invention has higher resolution.

Considering that energy of the green light and blue light is higher than that of the red light, it will be easier to convert of the green light or blue light with higher energy into red light with lower energy. Thus, in one exemplary embodiment of the present invention, the first light emitting layer 203 and the second light emitting layer 204 are respectively a green light emitting layer and a blue light emitting layer, and the light color conversion layer 205 is configured to convert green light or blue light into red light.

According to embodiments of the present invention, many ways may be employed so that only one light emitting layer will emit light within the second light emitting unit 30. For example, carrier transportation characteristics of the first light emitting layer 203 and the second light emitting layer 204 and/or an energy level relationship between the first light emitting layer 203 and the second light emitting layer 204 may be controlled or configured, so that holes from the anode 201 and electrons from the cathode 202 can only be combined within one light emitting layer within the second light emitting unit 30, that is, the holes from the anode 201 or the electrons from the cathode 202 cannot reach the other light emitting layer within the second light emitting unit 30, for example, not reach the first light emitting layer 203, thus the other light emitting layer will no emit light.

As an example, if it is desired that the first light emitting layer 203 within the second light emitting unit 30 does not emit light, the carrier transportation characteristic of the first light emitting layer 203 may be controlled or configured for facilitating transportation of holes, thus holes injected from the anode 201 would not or rarely reside within the first light emitting layer 203 of the second light emitting unit 30, but will flow into the second light emitting layer 204, and the holes and the electrons are combined within the second light emitting layer 204 so as to emit light, while the first light emitting layer 203 will not emit light because the holes and the electrons are not combined within the first light emitting layer 203.

In addition, the above effect may also be achieved by appropriately designing energy level. Specifically, in the second light emitting unit, an HOMO(Highest Occupied Molecular Orbital)energy level of the first light emitting layer 203 may be configured to be the same as or be extremely close to that of the second light emitting layer 204, so that holes injected from the anode 201 would not or rarely reside within the first light emitting layer 203, but will flow into the second light emitting layer 204; and meanwhile, LUMO(Lowest Unoccupied Molecular Orbital) energy levels of the first light emitting layer 203 and the second light emitting layer 204 are configured so that there is a larger difference therebetween, such that electrons injected from the cathode 202 will substantially reside within the second light emitting layer 204, thereby the holes and the electrons can only be combined so as to emit light within the second light emitting layer 204.

Of course, a combination of the above two ways may be utilized so that within the second light emitting unit 30, one light emitting layer will emit light while the other one light emitting layer will not emit light. It will be understood by those skilled in the art that changes in the carrier transportation characteristics and/or the energy level relationship may be achieved by doping, selecting materials or the like, which is not limited here.

It is noted that the respective color light emitting layers will normally emit light only when the anode 201 and the cathode 202 work at the same time, and both holes from the anode 201 and electrons from the cathode 202 can be injected into the light emitting layers; or else, even if the first light emitting layer 203 is called herein as, for example, a blue light emitting layer, the blue light emitting layer will not emit light if the holes and the electrons are not combined within the blue light emitting layer of the second light emitting unit 30.

Further, among existing luminescent materials for manufacturing OLED displays, efficiency of a green luminescent material is much higher than that of a blue luminescent material, thus, in one example, only the second light emitting layer 204 can emit light within the second light emitting unit 30, and the second light emitting layer 204 is a green light emitting layer; in such as case, the light color conversion layer 205 may be provided within the second light emitting unit 30 or the third light emitting unit 40, on a light exiting side of its corresponding organic material functional layer.

Exemplarily, the material for the light color conversion layer 205 may include cyanine dyes such as 4-(Dicyanomethylene)-2-methyl-6-(p-dimethylaminostyryl)-4H-pyran, DCM-2 and DCJTB, 4,4-Difluoro-1,3,5,7-tetramethyl-4-bora-3a,4a-diaza-s-indacene, Lumogen red, Nile red or the like.

Figure 4:
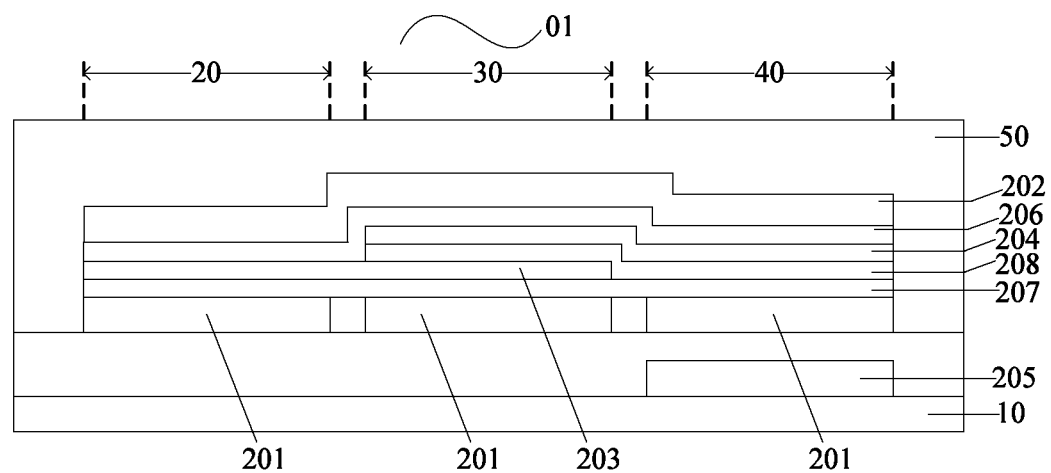
FIG. 4 is a structural schematic diagram showing a portion of an OLED display including a barrier layer provided according to an exemplary embodiment of the present invention.
Figure 5:
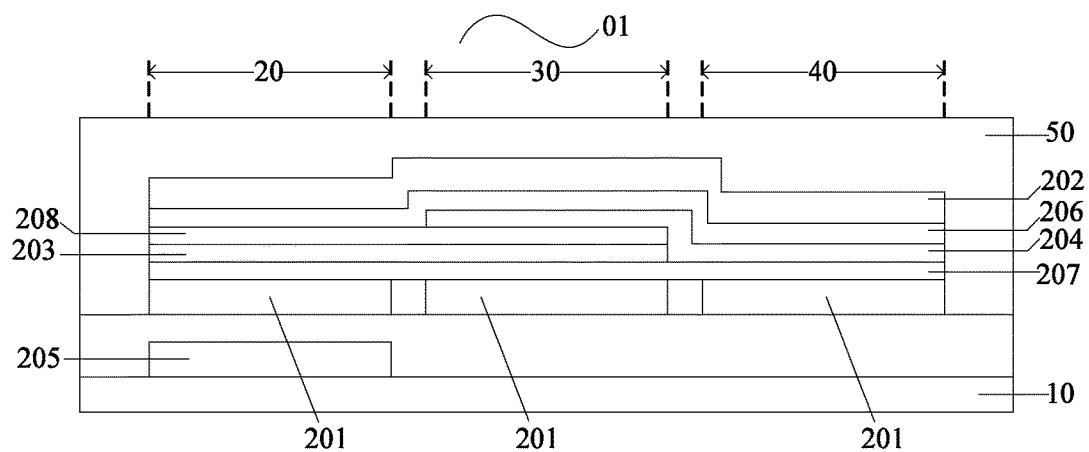
FIG. 5 is a structural schematic diagram showing a portion of an OLED display including a barrier layer provided according to a still further exemplary embodiment of the present invention.

According to one exemplary embodiment of the present invention, as shown in FIGS. 4 and 5, the OLED display 01 may further comprise a barrier layer 208 arranged between the first light emitting layer 203 and the second light emitting layer 204 within the second light emitting unit 30, and the barrier layer 208 is configured, within the second light emitting unit 30, to block one of the electrons and the holes, which has been injected into one light emitting layer, from being injected into the other light emitting layer, and to allow the other one of the electrons and the holes to be injected into the one light emitting layer. Further, the barrier layer 208 may extend into one of the first light emitting unit 20 and the third light emitting unit 30 of the same one light emitting array unit, and is configured to allow both of the electrons and the holes to be injected into the light emitting layer of the light emitting unit into which the barrier layer extends. As shown in FIG. 4, the barrier layer 208 is arranged within the second light emitting unit 30 and the third light emitting unit 40, while in FIG. 5, the barrier layer 208 is arranged within the first light emitting unit 20 and the second light emitting unit 30.

In an example shown in FIG. 4, when the anode 201 is provided close to the substrate 10 and the cathode 202 is provided away from the substrate 10, the barrier layer 208 may, within the second light emitting unit 30, block electrons which have been injected into the second light emitting layer 204 from being injected into the first light emitting layer 203, so that the first light emitting layer 203 within the second light emitting unit 30 will not emit light due to lack of injection of electrons; holes, which have been injected into the barrier layer 208, may pass through the barrier layer 208 and enter into the second light emitting layer 204, thereby the holes and the electrons are combined so as to emit light within the second light emitting layer 204 of the second light emitting unit 30. As shown in FIG. 4, the barrier layer 208 may extends into the third light emitting unit 40, between the anode 201 and the second light emitting layer 204 (for example, between the hole transportation layer 207 and the second light emitting layer 204), and is configured to allow holes from the anode 201 to enter into the second light emitting layer 204.

In this case, the second light emitting layer 204 will emit light within both the second light emitting unit 30 and the third light emitting unit 40, while it is required that the two light emitting units emit light having different color so as to achieve a normal display, thus, the light color conversion layer 205 needs to be provided on the light exiting side of the second light emitting layer 204 within the second light emitting unit 30 or the third light emitting unit 40 (in FIG. 4, the third light emitting unit 40 is taken as an example). Among others, depending on characteristics of the second light emitting layer 204, and organic materials such as the electron transportation layer 206, the hole transportation layer 207 and the like on either side of the second light emitting layer 204, the light color conversion layer 205 may be preferably arranged on a light exiting side of the organic material functional layer.

Likewise, in an example shown in FIG. 5, when the anode 201 is provided close to the substrate 10 and the cathode 202 is provided away from the substrate 10, the barrier layer 208 may, within the second light emitting unit 30, block holes which have been injected into the first light emitting layer 203 from being injected into the second light emitting layer 204, so that the second light emitting layer 204 within the second light emitting unit 30 will not emit light due to lack of injection of holes; electrons, which have been injected into the barrier layer 208, may pass through the barrier layer 208 and enter into the first light emitting layer 203, thereby the holes and the electrons are combined so as to emit light within the first light emitting layer 203 of the second light emitting unit 30. As shown in FIG. 5, the barrier layer 208 may extends into the first light emitting unit 20, between the cathode 202 and the first light emitting layer 203 (for example, between the electron transportation layer 206 and the first light emitting layer 203), and is configured to allow electrons from the cathode 202 to enter into the first light emitting layer 203.

In this case, the first light emitting layer 203 will emit light within both the second light emitting unit 30 and the third light emitting unit 40, while it is required that the two light emitting units emit light having different color so as to achieve a normal display, thus, the light color conversion layer 205 needs to be provided on the light exiting side of the first light emitting layer 203 within the second light emitting unit 30 or the first light emitting unit 20 (in FIG. 5, the first light emitting unit 20 is taken as an example). Among others, depending on characteristics of the first light emitting layer 203, and organic materials such as the electron transportation layer 206, the hole transportation layer 207 and the like on either side of the first light emitting layer 203, the light color conversion layer 205 may be preferably arranged on a light exiting side of the organic material functional layer.

Figure 6:
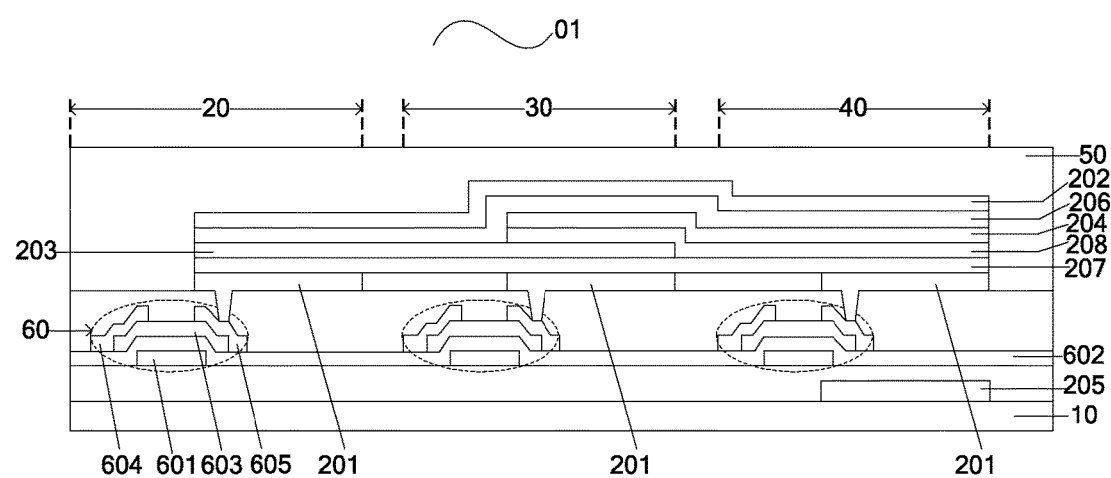
FIG. 6 is a structural schematic diagram showing a portion of a bottom light emitting type OLED display including thin film transistors provided according to an exemplary embodiment of the present invention.
Figure 7:
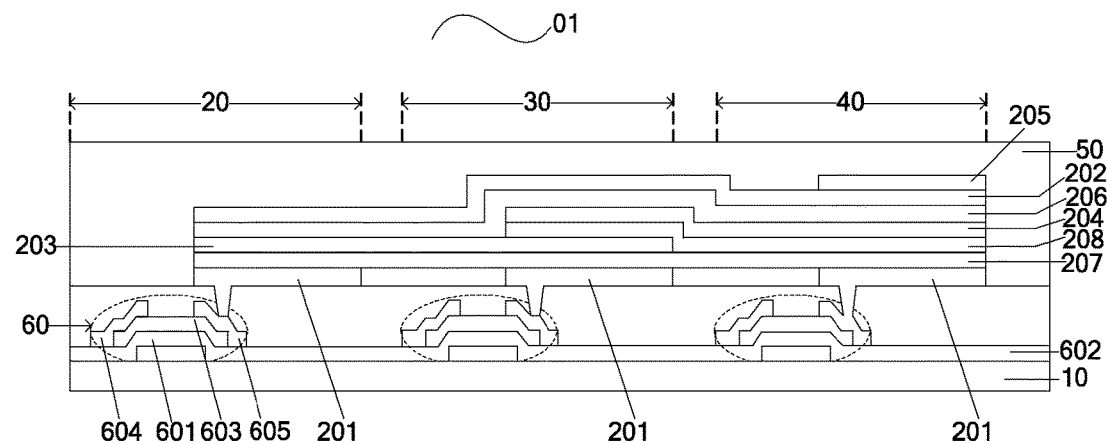
FIG. 7 is a structural schematic diagram showing a portion of a top light emitting type OLED display including thin film transistors provided according to an exemplary embodiment of the present invention.
Figure 8:
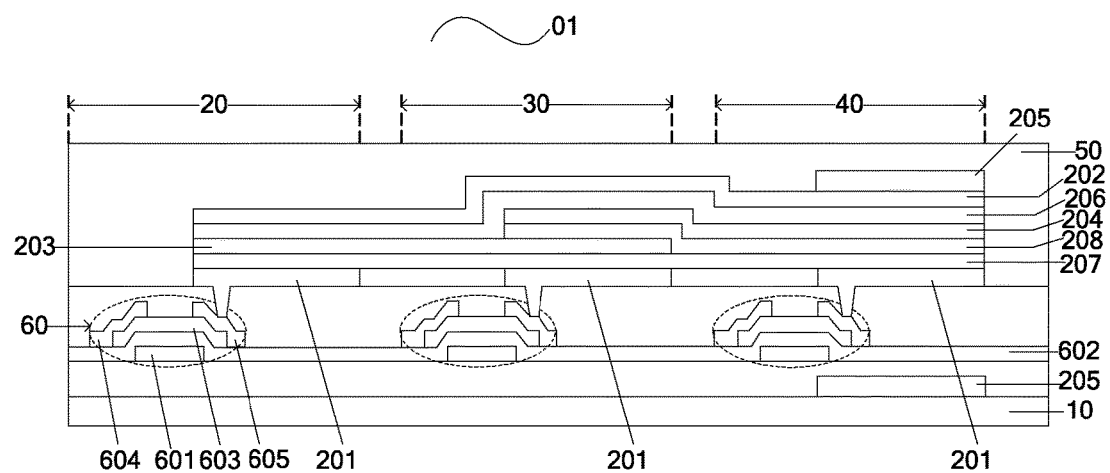
FIG. 8 is a structural schematic diagram showing a portion of a double-face light emitting type OLED display including thin film transistors provided according to an exemplary embodiment of the present invention.

In embodiments shown in FIGS. 6-8, the OLED display 01 may further comprise thin film transistors each corresponding to the respective light emitting units. Wherein, each thin film transistor 60 comprises a gate 601, a gate insulating layer 602, a semiconductor active layer 603, a source 604 and a drain 605. In examples shown in the figures, the drain 605 of the thin film transistor 60 is electrically connected with the anode 201 of its corresponding light emitting unit, and the thin film transistor 60 is provided close to the anode 201 of its corresponding light emitting unit. The OLED display 01 may further comprise gate lines electrically connected with the gates 601, gate line lead wires (not shown in figures), data lines electrically connected with the sources 604, data line lead wires (not shown in figures) and the like.

It is noted that the thin film transistor 60 is a semiconductor unit having a switching characteristic, and may be of a top gate type or of a bottom gate type (shown in FIGS. 6-8), which is not limited here.

Besides the arrangements shown in FIGS. 6-8, the thin film transistor may be provided on a packaging base plate, and the drain of the thin film transistor is electrically connected with the anode or cathode of the corresponding light emitting unit arranged on the substrate.

In the arrangement shown in FIG. 6, the light color conversion layer 205 is arranged between the anode 201 of the third light emitting unit 40 and the substrate 10, when the anode 201 is made of a transparent material and the cathode 202 is made of an opaque material, that is, when the OLED display 01 is of a bottom light emitting type.

In the arrangement shown in FIG. 7, the light color conversion layer 205 is arranged on one side of the cathode 202 of the third light emitting unit 40 away from the substrate 10, when the cathode 202 is made of a transparent material and the anode 201 is made of an opaque material, that is, when the OLED display 01 is of a top light emitting type.

In the arrangement shown in FIG. 8, there are provided, within the third light emitting unit 40, the light color conversion layers 205 respectively between the anode 201 and the substrate 10 and on one side of the cathode 202 away from the substrate 10, when both the anode 201 and the cathode 202 are made of transparent materials, that is, when the OLED display 01 is of a double-face light emitting type.

It is noted that since the anodes 201 are discontinuous or discrete and correspond to the light emitting unit in an one-to-one relationship, in one example, a pixel isolator layer may be arranged between adjacent anodes 201, and on one hand, isolates the light emitting units from each other, and on the other hand, fills and levels up the layer where the anode 201 is located so as to facilitate manufacturing of subsequent layers.

A plurality of embodiments of the present invention further provides a method of manufacturing an OLED display. With reference to FIGS. 1 to 3, the OLED display 01 may comprises a substrate 10 and a plurality of light emitting array units provided and periodically arranged on the substrate, each light emitting array unit comprising a first light emitting unit 20, a second light emitting unit 30 and a third light emitting unit 40 arranged in this order. The method comprises steps of forming the first light emitting unit 20, the second light emitting unit 30 and the third light emitting unit 40 for each light emitting array unit, the steps comprising following sub-steps of:

forming, on the substrate 10, first electrodes through a patterning process at positions corresponding to the first light emitting unit 20, the second light emitting unit 30 and the third light emitting unit 40; the first electrode may be the anode 201 or the cathode 202 as described above;

forming, on the substrate formed with the first electrodes, a first light emitting layer 203 through an evaporation process within regions corresponding to the first light emitting unit 20 and the second light emitting unit 30;

forming, on the substrate formed with the first light emitting layer 203, a second light emitting layer 204, which emits light having a color different from that of light emitted by the first light emitting layer 203, through an evaporation process within regions corresponding to the second light emitting unit and the third light emitting unit; wherein within the second light emitting unit 30, the first light emitting layer 203 and the second light emitting layer 204 overlap with each other and are configured so that only one of them is capable of emitting light; for example, as described above, the carrier transportation characteristics of the first light emitting layer 203 and the second light emitting layer 204 and/or the energy level relationship between the first light emitting layer 203 and the second light emitting layer 204 are appropriately controlled and designed so that only the first light emitting layer 203 or only the second light emitting layer 204 can emit light within the second light emitting unit 30; and forming, on the substrate formed with the second light emitting layer 204, a second electrode through a patterning process at positions corresponding to the first light emitting unit 20, the second light emitting unit 30 and the third light emitting unit 40; wherein the second electrode is the cathode 202 when the first electrode is the anode 201, or the second electrode is the anode 201 when the first electrode is the cathode 202.

The method further comprises a step of forming, within one of two light emitting unit of each light emitting array unit which have the same light emitting layer for emitting light, a light color conversion layer 205 through a patterning process on a light exiting side of the one light emitting unit, the light color conversion layer being configured to convert light from its corresponding light emitting layer to light having a color different from those of light emitted by other light emitting units of the light emitting array unit.

It is noted that besides forming the light emitting layers within respective light emitting unit, an electron transportation layer 206 and a hole transportation layer 207 may be also formed on either side of the light emitting layer; Further, in order improve efficiency of injection of electrons and holes into the light emitting layers, an electron injection layer may be also formed between the cathode 202 and the electron transportation layer 206, and a hole injection layer may be also formed between the anode 201 and the hole transportation layer 207; wherein, each light emitting unit comprises a composite organic material functional layer consisted of these layers of organic material.

As described above, the first light emitting unit 20, the second light emitting unit 30 and the third light emitting unit 40 may respectively correspond to one of a red light emitting unit, a green light emitting unit, and a blue light emitting unit, and the specific corresponding relationship there among is not limited here.

The second light emitting unit 30 includes cascaded first light emitting layer 203 and second light emitting layer 204, which emit light of different colors according to the arrangement of the present invention. Thus, only one of the light emitting layers within the second light emitting unit 30 is allowed to emit light, that is, only the first light emitting layer 203 or only the second light emitting layer 204 emits light, thereby avoiding mixed color due to simultaneous emitting of light of the two light emitting layers within the second light emitting unit 30.

For example, when the first light emitting layer 203 within the second light emitting unit 30 is configured to emit light, it emits light having the same color as that of light emitted by the first light emitting layer 203 within the first light emitting unit 20; thus, the light color conversion layer 205 is provided on the light exiting side of the first light emitting layer 203 within the first light emitting unit 20 or the second light emitting unit 30, thereby differentiating light emitted from the first light emitting unit 20 from light that emitted from the second light emitting unit 30 in color. Alternatively, when the second light emitting layer 204 within the second light emitting unit 30 is configured to emit light, it emits light having the same color as that of light emitted by the second light emitting layer 204 within the third light emitting unit 40; thus, the light color conversion layer 205 is provided on the light exiting side of the second light emitting layer 204 within the second light emitting unit 30 or the third light emitting unit 40 so as to differentiate light emitted from the second light emitting unit 30 from that emitted from the third light emitting unit 40 in color.

The patterning process used in the above method may include steps of film-forming, photoresist coating, exposing, developing, etching, peeling off and the like. The evaporation process is used to directly form a pattern having a particular shape on a particular region by an evaporation method, without the steps of photoresist coating, exposing, developing, etching, peeling off and the like.

In the method of manufacturing an OLED display provided according to the embodiments of the present invention, the first light emitting layer 203 are formed within regions corresponding to both of the first light emitting unit 20 and the second light emitting unit 30, meanwhile, the second light emitting layer 204 is formed within regions corresponding to both of the second light emitting unit 30 and the third light emitting unit 40, and the first light emitting layer 203 and the second light emitting layer 204 overlap, preferably, completely overlap, with each other within the second light emitting unit 30, thereby the first light emitting layer 203 within the first light emitting unit 20, the first light emitting layer 203 or second light emitting layer 204 within the second light emitting unit 30, and the second light emitting layer 204 within the third light emitting unit 40 can be controlled to emit light; from this, the position where the light color conversion layer 205 is formed is selected so that the first light emitting unit 20, the second light emitting unit 30 and the third light emitting unit 40 respectively emit one of blue, green and red light. In this method, each of the first light emitting layer 203 and the second light emitting layer 204 formed through an evaporation process may have a width which is substantially equal to a minimum precision width of a metal mask used in the evaporation process, thereby reducing the width of the light emitting layer within each light emitting unit. With the embodiments of the present invention, when compared to prior arts, it can avoid the problem of low resolution of the OLED display resolution due to limitation of precision in pattern size of the metal mask when manufacturing the light emitting layers within respective light emitting units, and the OLED display provided according to the embodiments of the present invention has higher resolution.

Considering efficiency of a green luminescent material is much higher than that of a blue luminescent material, thus, in one exemplary embodiment, as shown in FIGS. 1-3, only the second light emitting layer 204 can emit light within the second light emitting unit 30, and the second light emitting layer 204 is a green light emitting layer. That is, the first light emitting layer 203 within the first light emitting unit 20 is a blue light emitting layer, the second light emitting layer within the second light emitting unit 30 and the third light emitting unit 40 is a green light emitting layer, and the first light emitting layer 203 within the second light emitting unit 30 will not emit light; in such a case, the light color conversion layer 205 is formed on a light exiting side of the organic material functional layer within the second light emitting unit 30 or within the third light emitting unit 40.

Referring to FIG. 4 and FIG. 5, the method may further comprise, after forming the first light emitting layer 203 and before forming the second light emitting layer 204, the following step of:

forming a barrier layer 208 within a region corresponding to the second light emitting unit 30, the barrier layer 208 being configured, within the second light emitting unit 30, to block one of the electrons and the holes, which has been injected into one light emitting layer, from being injected into the other light emitting layer, and to allow the other one of the electrons and the holes to be injected into the one light emitting layer.

In one exemplary embodiment, the barrier layer may be formed through an evaporation process within regions corresponding to the first light emitting unit 20 and the second light emitting unit 30, or regions corresponding to the second light emitting unit 30 and the third light emitting unit 40, the barrier layer 208 is configured to allow both of the electrons and the holes to be injected into the light emitting layer of the first light emitting unit 20 or the third light emitting unit 40, but to allow both of the electrons and the holes to be only injected into one of the light emitting layers within the second light emitting unit 30.

As such, the barrier layer 208 is formed so that only one of the light emitting layers within the second light emitting unit 30 is allowed to emit light.

With reference to FIG. 4, when the anode 201 is provided close to the substrate 10 and the cathode 202 is provided away from the substrate 10, the barrier layer 208 may be formed within the second light emitting unit 30 and the third light emitting unit 40 after forming the first light emitting layer 203, and may, within the second light emitting unit 30, block electrons which have been injected into the second light emitting layer 204 from being injected into the first light emitting layer 203, so that the first light emitting layer 203 within the second light emitting unit 30 will not emit light due to lack of injection of electrons; holes, which have been injected into the barrier layer 208, may pass through the barrier layer 208 and enter into the second light emitting layer 204, thereby the holes and the electrons are combined so as to emit light within the second light emitting layer 204 of the second light emitting unit 30.

In this case, the second light emitting layer 204 will emit light within both the second light emitting unit 30 and the third light emitting unit 40, while it is required that the two light emitting units emit light having different color so as to achieve a normal display, thus, the light color conversion layer 205 needs to be provided on the light exiting side of the second light emitting layer 204 within the second light emitting unit 30 or the third light emitting unit 40 (in FIG. 4, the third light emitting unit 40 is taken as an example), and is configured to convert light emitted from its corresponding light emitting unit into light of other different color.

Likewise, referring to FIG. 5, when the anode 201 is provided close to the substrate 10 and the cathode 202 is provided away from the substrate 10, the barrier layer 208 may be formed within the second light emitting unit 30 and the third light emitting unit 40 after forming the first light emitting layer 203 and before forming the second light emitting layer 204, and may block holes which have been injected into the first light emitting layer 203 within the second light emitting unit 30, from being injected into the second light emitting layer 204 within the second light emitting unit 30, so that the second light emitting layer 204 within the second light emitting unit 30 will not emit light due to lack of injection of holes; electrons, which have been injected into the barrier layer 208, may pass through the barrier layer 208 and enter into the first light emitting layer 203, thereby the holes and the electrons are combined so as to emit light within the first light emitting layer 203 of the second light emitting unit 30.

In this case, the first light emitting layer 203 will emit light within both the second light emitting unit 30 and the third light emitting unit 40, while it is required that the two light emitting units emit light having different color so as to achieve a normal display, thus, the light color conversion layer 205 needs to be provided on the light exiting side of the first light emitting layer 203 within the second light emitting unit 30 or the first light emitting unit 20 (in FIG. 5, the first light emitting unit 20 is taken as an example), and is configured to convert light emitted from its corresponding light emitting unit into light of other different color.

With reference to FIGS. 6 to 8, before forming the first electrodes, the method may further comprise a step of forming thin film transistors 60 each corresponding to respective light emitting units. When the first electrode is an anode and the second electrode is a cathode, a drain of the thin film transistor 60 is electrically connected with the anode 201.

The thin film transistor 60 comprises a gate 601, a gate insulating layer 602, a semiconductor active layer 603, a source 604 and a drain 605, a gate line electrically connected with the gate 601, a gate line lead wire (not shown in figures), a data line electrically connected with the source 604, a data line lead wire (not shown in figures) and the like. It is noted that the thin film transistor 60 may be of a top gate type or of a bottom gate type, which is not limited here.

Referring to FIG. 6, the light color conversion layer 205 is arranged between the anode 201 and the substrate 10, when the anode 201 is made of a transparent material and the cathode 202 is made of an opaque material, that is, when the OLED display 01 is of a bottom light emitting type.

As shown in FIG. 7, the light color conversion layer 205 is arranged on one side of the cathode 202 away from the substrate 10, when the cathode 202 is made of a transparent material and the anode 201 is made of an opaque material, that is, when the OLED display 01 is of a top light emitting type.

As shown in FIG. 8, there are provided, the light color conversion layers 205 respectively between the anode 201 and the substrate 10 and on one side of the cathode 202 away from the substrate 10, when both the anode 201 and the cathode 202 are made of transparent materials, that is, when the OLED display 01 is of a double-face light emitting type.

It is noted that the anodes 201 are discontinuous or discrete and correspond to the light emitting unit in an one-to-one relationship, thus in one embodiment, a pixel isolator layer may be arranged between adjacent anodes 201, and on one hand, isolates the light emitting units from each other, and on the other hand, fills and levels up the layer where the anode 201 is located so as to facilitate manufacturing of subsequent layers.

Although several exemplary embodiments have been shown and described, the scope of the present invention is not limited to the specific forms described in the embodiments, and it would be appreciated by those skilled in the art that various changes or modifications may be made in these embodiments without departing from the principles and spirit of the disclosure, the changes or modifications falling within the scope of the disclosure. Thus, the scope of the present invention is defined in the claims and their equivalents.

What is claimed is:

1. An OLED display, comprising a substrate and a plurality of light emitting array units provided and periodically arranged on the substrate, each light emitting array unit comprising a first light emitting unit, a second light emitting unit and a third light emitting unit arranged in this order, wherein, each of the first light emitting unit, the second light emitting unit and the third light emitting unit comprises an anode, a cathode and an organic material functional layer located between the anode and the cathode, the organic material functional layer comprising a light emitting layer;

for each light emitting array unit, the first light emitting layer is only formed within the first light emitting unit and the second light emitting unit, the second light emitting layer is only formed within the second light emitting unit and the third light emitting unit, and the first light emitting layer is made of a material emitting light having a color different from that of light emitted by the second light emitting layer;

in the second light emitting unit, the first light emitting layer and the second light emitting layer overlap with each other and only one of the first light emitting layer and the second light emitting layer allows holes and electrons to be combined therein so as to emit light; and in each light emitting array unit, one of two light emitting units which have the same light emitting layer for emitting light further comprises a light color conversion layer arranged on a light exiting side of the one light emitting unit, and made of a material converting light from its corresponding light emitting layer to light having a color different from those of light emitted by other light emitting units of the light emitting array unit.

2. The OLED display according to claim 1, wherein the first light emitting layer and the second light emitting layer are formed through an evaporation process, and a width of each of the first light emitting layer and the second light emitting layer is substantially equal to a minimum precision width of a metal mask used in the evaporation process.

3. The OLED display according to claim 1, wherein,
the first light emitting layer and the second light emitting layer are respectively a green light emitting layer and a blue light emitting layer; and
the light color conversion layer is configured to convert green light or blue light into red light.

4. The OLED display according to claim 1, wherein,
the second light emitting layer within the second light emitting unit is configured for emitting light, and the light color conversion layer is arranged on a light exiting side of the organic material functional layer within the second light emitting unit or within the third light emitting unit; or
the first light emitting layer within the second light emitting unit is configured for emitting light, and the light color conversion layer is arranged on a light exiting side of the organic material functional layer within the first light emitting unit or within the second light emitting unit.

5. The OLED display according to claim 1, wherein carrier transportation characteristics of the first light emitting layer and the second light emitting layer and/or an energy level relationship between the first light emitting layer and the second light emitting layer are/is configured so that holes from the anode and electrons from the cathode can only be combined within one of the first light emitting layer and the second light emitting layer within the second light emitting unit.

6. The OLED display according to claim 1, wherein each light emitting array unit further comprises a barrier layer arranged between the first light emitting layer and the second light emitting layer within the second light emitting unit, and the barrier layer is configured, within the second light emitting unit, to block one of electrons and holes, which has been injected into one of the first and second light emitting layer, from being injected into the other of the first and second light emitting layer, and to allow the other one of the electrons and the holes to be injected into the one of the first and second light emitting layer.

7. The OLED display according to claim 6, wherein the barrier layer extends into one of the first light emitting unit and the third light emitting unit of the same one light emitting array unit, and is configured to allow both of the electrons and the holes to be injected into the light emitting layer of the light emitting unit into which the barrier layer extends.

8. The OLED display according to claim 1, wherein,
the OLED display further comprises thin film transistors each corresponding to the respective light emitting units, a drain of each thin film transistor is electrically connected with the anode of its corresponding light emitting unit, and each thin film transistor is arranged close to the anode of its corresponding light emitting unit.

9. The OLED display according to claim 8, wherein the light color conversion layer is arranged between the anode and the substrate, the anode is made of a transparent material and the cathode is made of an opaque material.

10. The OLED display according to claim 8, wherein the light color conversion layer is arranged on one side of the cathode away from the substrate, the cathode is made of a transparent material and the anode is made of an opaque material.

11. The OLED display according to claim 8, wherein the light color conversion layers are provided respectively between the anode and the substrate and on one side of the cathode away from the substrate, and both the anode and the cathode are made of transparent materials.

12. A method of manufacturing an OLED display, the OLED display comprising a substrate and a plurality of light emitting array units provided and periodically arranged on the substrate, each light emitting array unit comprising a first light emitting unit, a second light emitting unit and a third light emitting unit arranged in this order; the method comprises steps of forming the first light emitting unit, the second light emitting unit and the third light emitting unit for each light emitting array unit, the steps comprising:
forming, on the substrate, first electrodes through a patterning process at positions corresponding to the first light emitting unit, the second light emitting unit and the third light emitting unit;
forming, on the substrate formed with the first electrodes, a first light emitting layer through an evaporation process only within regions corresponding to the first light emitting unit and the second light emitting unit;
forming, on the substrate formed with the first light emitting layer, a second light emitting layer, which emits light having a color different from that of light emitted by the first light emitting layer, through an evaporation process only within regions corresponding to the second light emitting unit and the third light emitting unit, such that within the second light emitting unit, the first light emitting layer and the second light emitting layer overlap with each other and only one of the first light emitting layer and the second light emitting layer allows holes and electrons to be combined therein so as to emit light; and
forming, on the substrate formed with the second light emitting layer, a second electrode through a patterning process at positions corresponding to the first light emitting unit, the second light emitting unit and the third light emitting unit;
the method further comprises a step of forming, within one of two light emitting units of each light emitting array unit which have the same light emitting layer for emitting light, a light color conversion layer through a patterning process on a light exiting side of the one light emitting unit made of a material converting light from its corresponding light emitting layer to light having a color different from those of light emitted by other light emitting units of the light emitting array unit.

13. The method according to claim 12, wherein each of the first light emitting layer and the second light emitting layer formed through the evaporation process has a width which is substantially equal to a minimum precision width of a metal mask used in the evaporation process.

14. The method according to claim 12, wherein
the first light emitting layer is selected as one of a green light emitting layer and a blue light emitting layer, and the second light emitting layer is selected as the other one of the green light emitting layer and the blue light emitting layer, and
the light color conversion layer is configured to convert green light or blue light into red light.

15. The method according to claim 12, wherein,
the second light emitting layer within the second light emitting unit is configured for emitting light, and the step of forming the light color conversion layer comprises forming, within a region corresponding to the second light emitting unit or the third light emitting unit, the light color conversion layer on a light exiting side of the light emitting unit; or the first light emitting layer within the second light emitting unit is configured for emitting light, and the step of forming the light color conversion layer comprises forming, within a region corresponding to the first light emitting unit or the second light emitting unit, the light color conversion layer on a light exiting side of the light emitting unit.

16. The method according to claim 12, wherein the steps of forming the first light emitting layer and the second light emitting layer comprise:

configuring carrier transportation characteristics of the first light emitting layer and the second light emitting layer and/or an energy level relationship between the first light emitting layer and the second light emitting layer so that holes from the anode and electrons from the cathode can only be combined within one of the first light emitting layer and the second light emitting layer within the second light emitting unit.

17. The method according to claim 12, wherein the method further comprises, after forming the first light emitting layer and before forming the second light emitting layer, the following step of:

forming a barrier layer at least within a region corresponding to the second light emitting unit, the barrier layer being configured, within the second light emitting unit, to block one of electrons and holes, which has been injected into one of the first and second light emitting layer, from being injected into the other of the first and second light emitting layer, and to allow the other one of the electrons and the holes to be injected into the one of the first and second light emitting layer.

18. The method according to claim 17, wherein the step of forming the barrier layer comprises:

forming the barrier layer through an evaporation process within regions corresponding to the first light emitting unit and the second light emitting unit, or regions corresponding to the second light emitting unit and the third light emitting unit, of each light emitting array unit, so as to allow both of the electrons and the holes to be injected into the light emitting layer of the first light emitting unit or the third light emitting unit.

19. The method according to claim 12, wherein before forming the first electrodes, the method further comprises a step of forming a thin film transistor;

wherein the first electrode is an anode and the second electrode is a cathode, and a drain of the thin film transistor is electrically connected with the anode.

20. The method according to claim 12, wherein the first electrode is made of a transparent material and the second electrode is made of an opaque material, and the light color conversion layer is formed on the substrate before forming the first electrodes; or the second electrode is made of a transparent material and the first electrode is made of an opaque material, and the light color conversion layer is formed on one side of the second electrode away from the substrate after forming the second electrode; or both the first electrode and the second electrode are made of transparent materials, and there are formed the light color conversion layers respectively between the first electrode and the substrate and on one side of the second electrode away from the substrate.

* * * * *